United States Patent
Le et al.

(10) Patent No.: US 11,374,265 B2
(45) Date of Patent: Jun. 28, 2022

(54) BATTERY REPAIR METHOD AND APPARATUS

(71) Applicant: HUAWEI DIGITAL POWER TECHNOLOGIES CO., LTD., Shenzhen (CN)

(72) Inventors: Bin Le, Dongguan (CN); Yuqin Xu, Shenzhen (CN); Liqiang Ye, Shenzhen (CN)

(73) Assignee: Huawei Digital Power Technologies Co., Ltd., Shenzhen (CN)

(*) Notice: Subject to any disclaimer, the term of this patent is extended or adjusted under 35 U.S.C. 154(b) by 448 days.

(21) Appl. No.: 16/405,613

(22) Filed: May 7, 2019

(65) Prior Publication Data
US 2019/0267675 A1 Aug. 29, 2019

Related U.S. Application Data

(63) Continuation of application No. PCT/CN2017/085976, filed on May 25, 2017.

(30) Foreign Application Priority Data

Nov. 7, 2016 (CN) .......................... 201610975840.9

(51) Int. Cl.
*H01M 10/42* (2006.01)
*H01M 10/12* (2006.01)
(Continued)

(52) U.S. Cl.
CPC ...... *H01M 10/4242* (2013.01); *G01R 31/367* (2019.01); *H01M 10/121* (2013.01); *H01M 10/42* (2013.01); *H01M 10/446* (2013.01)

(58) Field of Classification Search
CPC ........... H01M 10/4242; H01M 10/121; H01M 10/42; H01M 10/446; G01R 31/367; Y02E 60/10; Y02P 70/50
(Continued)

(56) References Cited

U.S. PATENT DOCUMENTS 5,918,186 A * 6/1999 Liu .................. H01M 10/6556
429/97
2011/0054815 A1 3/2011 Xu et al.

FOREIGN PATENT DOCUMENTS

CN 101067644 A 11/2007
CN 101635470 B 1/2010
(Continued)

OTHER PUBLICATIONS

Bao Rui, Research of substation battery on-line inspection and repair system, based on the important role of storage battery in substation DC system, Aug. 10-13, 2016, China International Conference on Electricity Distribution (CICED 2016) (Year: 2016).*
Hannington M. Ng'weno, Corrosion and Premature Capacity Loss of Standby Telecommunications Batteries—The Way Forward for Service Providers, IEICE/IEEE INTELEC'03, Oct. 19-23, 2003 (Year: 2003).*

*Primary Examiner* — M Baye Diao
(74) *Attorney, Agent, or Firm* — Leydig, Voit & Mayer, Ltd.

(57) ABSTRACT

Embodiments of the present application disclose a battery repair method and apparatus, and relate to the battery field, so as to improve a battery repair effect. The method includes: determining, by a power system, a failure mode of a battery according to an abuse record of the battery or a performance parameter of the battery, where the abuse record includes a usage record of a situation in which a preset usage range of the performance parameter of the battery is exceeded, and the performance parameter of the battery is used to represent performance of the battery; determining, by the power system according to the failure mode of the battery, a power repair policy for repairing the battery; and repairing, by the
(Continued)

power system, the battery according to a selected power repair policy. According to the method, a failing battery can be repaired.

20 Claims, 4 Drawing Sheets

(51) Int. Cl.
*H01M 10/44* (2006.01)
*G01R 31/367* (2019.01)

(58) Field of Classification Search
USPC .......................................................... 320/150
See application file for complete search history.

(56) References Cited

FOREIGN PATENT DOCUMENTS

| | | | |
|---|---|---|---|
| CN | 101894981 | A | 11/2010 |
| CN | 102117941 | A | 7/2011 |
| CN | 101635470 | B | 1/2012 |
| CN | 103401031 | A | 11/2013 |
| CN | 103401032 | A | 11/2013 |
| CN | 103579691 | A | 2/2014 |
| CN | 103579693 | A | 2/2014 |
| CN | 106505260 | A | 3/2017 |

\* cited by examiner

┌────────────────────────────────────────────────────────────────┐
│ A power system determines a failure mode of a battery according to an │
│ abuse record of the battery or a performance parameter of the battery, where │
│ the abuse record includes a usage record of a situation in which a preset │
│ usage range of the performance parameter of the battery is exceeded, and │
│ the performance parameter of the battery is used to represent performance │
│ of the battery │
└────────────────────────────────────────────────────────────────┘ ⟋ 201

┌────────────────────────────────────────────────────────────────┐
│ The power system determines, according to the failure mode of the battery, │
│ a power repair policy for repairing the battery, where when the failure mode │
│ of the battery is at least one of a water loss mode, a grid corrosion mode, or │
│ a thermal runaway mode, the power repair policy is: reducing a float │
│ charging voltage of the battery to charge the battery or reducing an │
│ equalized charging voltage to charge the battery or starting intermittent │
│ charging to charge the battery, and enhancing a refrigeration measure of the │
│ battery, and when the failure mode of the battery is at least one of an │
│ internal short-circuit mode, a weak battery mode, or a sulphation mode, the │
│ power repair policy is: when the battery is in a fully charged state, using a │
│ preset voltage and a preset current to charge the battery for a first preset │
│ time length, and enabling a temperature of the battery to be less than or │
│ equal to a first preset threshold, where the preset voltage is greater than or │
│ equal to a standard charging voltage of the battery, and the preset current is │
│ greater than or equal to a standard charging current of the battery │
└────────────────────────────────────────────────────────────────┘ ⟋ 202

┌────────────────────────────────────────────────────────────────┐
│ The power system repairs the battery according to a selected power repair │
│ policy │
└────────────────────────────────────────────────────────────────┘ ⟋ 203

FIG. 2

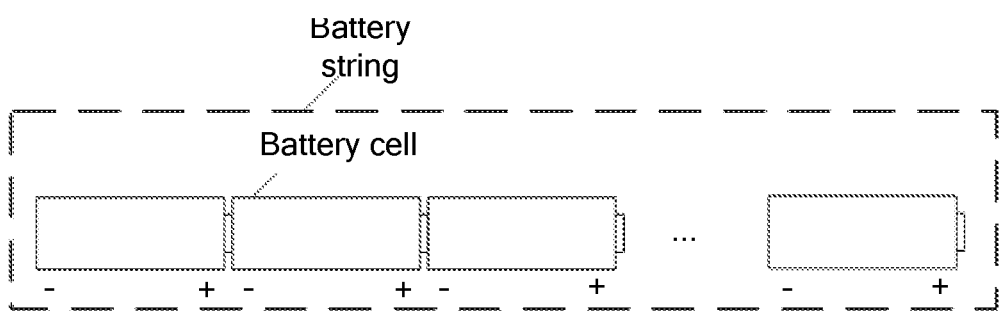

FIG. 3

BATTERY REPAIR METHOD AND APPARATUS

CROSS-REFERENCE TO RELATED APPLICATIONS

This application is a continuation of International Application No. PCT/CN2017/085976, filed on May 25, 2017, which claims priority to Chinese Patent Application No. 201610975840.9, filed on Nov. 7, 2016. The disclosures of the aforementioned applications are hereby incorporated by reference in their entireties.

TECHNICAL FIELD

The present application relates to the battery field, and in particular, to a battery repair method and apparatus.

BACKGROUND

A Valve Regulated Lead Acid Battery (VRLA) is of a seal structure. When the valve-regulated lead-acid battery is normally used, a phenomenon of acid leakage or acid fog exhausting does not occur, and therefore a device is not corroded. Therefore, the valve-regulated lead-acid battery is widely applied to an uninterruptible power system (UPS), a communications backup power supply, and an industrial energy storage system.

A useful life of the VRLA is very dependent on a usage environment and a usage method. When being used in an inappropriate condition, the VRLA fails, and consequently, the useful life of the VRLA is greatly shortened. When the VRLA fails, a capacity of the VRLA decreases. In this case, the VRLA may be repaired, so that a part of the capacity of the VRLA is recovered. Currently, when the VRLA fails, the VRLA is usually repaired by using a dedicated instrument (for example, a lead-acid battery repair instrument). When repairing a battery, these instruments can repair the battery only in a single mode, and repair all batteries in all failure modes by using a fixed repair procedure. Consequently, a repair effect is relatively poor.

SUMMARY

Embodiments of the present application provide a battery repair method and apparatus, so as to improve a battery repair effect.

To achieve the foregoing objective, the following technical solutions are used in the embodiments of the present application:

According to a first aspect, a battery repair method is provided, including: determining, by a power system, a failure mode of a battery according to an abuse record of the battery or a performance parameter of the battery, where the abuse record includes a usage record of a situation in which a preset usage range of the performance parameter of the battery is exceeded, and the performance parameter of the battery is used to represent performance of the battery; determining, by the power system according to the failure mode of the battery, a power repair policy for repairing the battery, where when the failure mode of the battery is at least one of a water loss mode, a grid corrosion mode, or a thermal runaway mode, the power repair policy is: reducing a float charging voltage of the battery to charge the battery or reducing an equalized charging voltage to charge the battery or starting intermittent charging to charge the battery, and enhancing a refrigeration measure of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, where the preset voltage is greater than or equal to a standard charging voltage of the battery, and the preset current is greater than or equal to a standard charging current of the battery; and repairing, by the power system, the battery according to a selected power repair policy.

According to the method provided in the first aspect, after the failure mode of the battery is determined, the power repair policy of the battery is further determined. For various existing failure modes and a combination of the failure modes, the battery is repaired in a specific manner in the present application, so that a useful life of the battery can be prolonged, and battery repair efficiency can be improved.

With reference to the first aspect, in a first possible implementation, when the failure mode of the battery is a combination of at least one failure mode in a first failure mode group and at least one failure mode in a second failure mode group, the power repair policy is: using a first repair policy to repair the battery, after the battery is fully charged, using a second repair policy to repair the battery, and after the second repair policy is used to repair the battery, reusing the first repair policy to repair the battery; the first failure mode group includes the water loss mode, the grid corrosion mode, and the thermal runaway mode, and the second failure mode group includes the internal short-circuit mode, the weak battery mode, and the sulphation mode; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; and the preset voltage is greater than or equal to the standard charging voltage of the battery, and the preset current is greater than or equal to the standard charging current of the battery.

When there are multiple failure modes of the battery, a uniform power repair policy may be used to repair the battery in the multiple failure modes at the same time in the first aspect and the first possible implementation of the first aspect, so as to improve battery repair efficiency.

With reference to the first aspect or the first possible implementation of the first aspect, in a second possible implementation, the determining, by a power system, a failure mode of a battery according to a performance parameter of the battery includes: obtaining, by the power system, at least one group of test results of the performance parameter of the battery, where one group of test results is corresponding to one test time point; and determining, by the power system, the failure mode of the battery according to the at least one group of test results.

With reference to the second possible implementation of the first aspect, in a third possible implementation, the determining, by the power system, the failure mode of the battery according to the at least one group of test results includes: determining, by the power system, a degree of matching between the at least one group of test results and a preset condition corresponding to each failure mode in a preset failure mode group; and determining, by the power system as the failure mode of the battery, a failure mode corresponding to a preset condition for which a degree of matching between the preset condition and the at least one group of test results is greater than or equal to a second preset threshold.

With reference to any one of the first aspect, or the first possible implementation to the third possible implementation of the first aspect, in a fourth possible implementation, after the power system repairs the battery according to the power repair policy, the method further includes: obtaining, by the power system, a value of the performance parameter of the battery after a third preset time length; determining, by the power system according to the value of the performance parameter of the battery, whether the power repair policy is valid; if yes, continuing, by the power system, to use the power repair policy to repair the battery until the repairing is completed; and if no, re-obtaining, by the power system, multiple groups of test results of the performance parameter of the battery, and re-determining the failure mode of the battery according to the multiple groups of test results, where one group of test results is corresponding to one test time point.

The failure mode may change in a battery repair process or the foregoing at least one group of test results has a relatively large test error due to an external reason, and consequently, the determined failure mode is inaccurate. Therefore, in the fourth possible implementation of the first aspect, it may be determined, after a third preset time length or period for repairing the battery, whether the power repair policy is valid, so as to adjust the power repair policy in a timely manner, and improve repair accuracy.

With reference to the fourth possible implementation of the first aspect, in a fifth possible implementation, the determining, by the power system according to the value of the performance parameter of the battery, whether the power repair policy is valid includes: when the failure mode is one or more of the water loss mode, the grid corrosion mode, or the thermal runaway mode, where the value of the performance parameter of the battery is a value of a float charging current of the battery, if the value of the float charging current of the battery is less than a float charging current average in the at least one group of test results, determining, by the power system, that the power repair policy is valid, and otherwise, determining, by the power system, that the power repair policy is invalid; and when the failure mode of the battery is one or more of the internal short-circuit mode, the weak battery mode, or the sulphation mode, where the value of the performance parameter of the battery is a temperature rise value and a capacity value of the battery, if the temperature rise value of the battery is less than a temperature rise average in the at least one group of test results, and/or when the capacity value of the battery is greater than a capacity average in the at least one group of test results, determining, by the power system, that the power repair policy is valid, and otherwise, determining, by the power system, that the power repair policy is invalid.

With reference to any one of the first aspect, or the first possible implementation to the fifth possible implementation of the first aspect, in a sixth possible implementation, the battery includes a battery string and/or a battery cell, and the battery string includes at least two battery cells.

With reference to any one of the first aspect, or the first possible implementation to the sixth possible implementation of the first aspect, in a seventh possible implementation, the performance parameter of the battery includes at least one of a charging voltage of the battery, a discharge voltage of the battery, a charging current of the battery, a discharge current of the battery, an internal resistance of the battery, the temperature of the battery, an accumulated discharge capacity of the battery, or a capacity of the battery.

According to a second aspect, a power system is provided, including: a first determining unit, configured to determine a failure mode of a battery according to an abuse record of the battery or a performance parameter of the battery, where the abuse record includes a usage record of a situation in which a preset usage range of the performance parameter of the battery is exceeded, and the performance parameter of the battery is used to represent performance of the battery; a second determining unit, configured to determine, according to the failure mode of the battery, a power repair policy for repairing the battery, where when the failure mode of the battery is at least one of a water loss mode, a grid corrosion mode, or a thermal runaway mode, the power repair policy is: reducing a float charging voltage of the battery to charge the battery or reducing an equalized charging voltage to charge the battery or starting intermittent charging to charge the battery, and enhancing a refrigeration measure of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, where the preset voltage is greater than or equal to a standard charging voltage of the battery, and the preset current is greater than or equal to a standard charging current of the battery; and a repair unit, configured to repair the battery according to a selected power repair policy.

Each unit in the power system provided in the second aspect is configured to perform the method provided in the first aspect. Therefore, for beneficial effects of the power system, refer to the beneficial effects of the method. Details are not described herein again.

With reference to the second aspect, in a first possible implementation, when the failure mode of the battery is a combination of at least one failure mode in a first failure mode group and at least one failure mode in a second failure mode group, the power repair policy is: using a first repair policy to repair the battery, after the battery is fully charged, using a second repair policy to repair the battery, and after the second repair policy is used to repair the battery, reusing the first repair policy to repair the battery; the first failure mode group includes the water loss mode, the grid corrosion mode, and the thermal runaway mode, and the second failure mode group includes the internal short-circuit mode, the weak battery mode, and the sulphation mode; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; and the preset voltage is greater than or equal to the standard charging voltage of the battery, and the preset current is greater than or equal to the standard charging current of the battery.

When there are multiple failure modes of the battery, a uniform power repair policy may be used to repair the battery in the multiple failure modes at the same time in the second aspect and the first possible implementation of the second aspect, so as to improve battery repair efficiency.

With reference to the second aspect or the first possible implementation of the second aspect, in a second possible implementation, the power system further includes an obtaining unit; the obtaining unit is configured to obtain at least one group of test results of the performance parameter of the battery, where one group of test results is corresponding to one test time point; and the first determining unit is specifically configured to determine the failure mode of the battery according to the at least one group of test results.

With reference to the second possible implementation of the second aspect, in a third possible implementation, the first determining unit is specifically configured to: determine a degree of matching between the at least one group of test results and a preset condition corresponding to each failure mode in a preset failure mode group; and determine, as the failure mode of the battery, a failure mode corresponding to a preset condition for which a degree of matching between the preset condition and the at least one group of test results is greater than or equal to a second preset threshold.

With reference to the possible implementation of the second aspect, in a fourth possible implementation, the obtaining unit is further configured to obtain a value of the performance parameter of the battery after a third preset time length; the power system further includes a judging unit, configured to determine, according to the value of the performance parameter of the battery, whether the power repair policy is valid; if yes, the repair unit continues to use the power repair policy to repair the battery until the repairing is completed; and if no, the obtaining unit re-obtains multiple groups of test results of the performance parameter of the battery, and the first determining unit is further configured to re-determine the failure mode of the battery according to the multiple groups of test results, where one group of test results is corresponding to one test time point.

The failure mode may change in a battery repair process or the foregoing at least one group of test results has a relatively large test error due to an external reason, and consequently, the determined failure mode is inaccurate. Therefore, in the fourth possible implementation of the second aspect, it may be determined, after a third preset time period for repairing the battery, whether the power repair policy is valid, so as to adjust the power repair policy in a timely manner, and improve repair accuracy.

With reference to the fourth possible implementation of the second aspect, in a fifth possible implementation, the judging unit is specifically configured to: when the failure mode is one or more of the water loss mode, the grid corrosion mode, or the thermal runaway mode, where the value of the performance parameter of the battery is a value of a float charging current of the battery, if the value of the float charging current of the battery is less than a float charging current average in the at least one group of test results, determine that the power repair policy is valid, and otherwise, determine that the power repair policy is invalid; and when the failure mode of the battery is one or more of the internal short-circuit mode, the weak battery mode, or the sulphation mode, where the value of the performance parameter of the battery is a temperature rise value and a capacity value of the battery, if the temperature rise value of the battery is less than a temperature rise average in the at least one group of test results, and/or when the capacity value of the battery is greater than a capacity average in the at least one group of test results, determine that the power repair policy is valid, and otherwise, determine that the power repair policy is invalid.

With reference to any one of the second aspect, or the first possible implementation to the fifth possible implementation of the second aspect, in a sixth possible implementation, the battery includes a battery string and/or a battery cell, and the battery string includes at least two battery cells.

With reference to any one of the second aspect, or the first possible implementation to the sixth possible implementation of the second aspect, in a seventh possible implementation, the performance parameter of the battery includes at least one of a charging voltage of the battery, a discharge voltage of the battery, a charging current of the battery, a discharge current of the battery, an internal resistance of the battery, the temperature of the battery, an accumulated discharge capacity of the battery, or a capacity of the battery.

According to a third aspect, a power system is provided, including: a memory and a processor, where the memory is configured to store code, and the processor is configured to execute the following actions according to the code: determining a failure mode of a battery according to an abuse record of the battery or a performance parameter of the battery, where the abuse record includes a usage record of a situation in which a preset usage range of the performance parameter of the battery is exceeded, and the performance parameter of the battery is used to represent performance of the battery; determining, according to the failure mode of the battery, a power repair policy for repairing the battery, where when the failure mode of the battery is at least one of a water loss mode, a grid corrosion mode, or a thermal runaway mode, the power repair policy is: reducing a float charging voltage of the battery to charge the battery or reducing an equalized charging voltage to charge the battery or starting intermittent charging to charge the battery, and enhancing a refrigeration measure of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, where the preset voltage is greater than or equal to a standard charging voltage of the battery, and the preset current is greater than or equal to a standard charging current of the battery; and repairing the battery according to a selected power repair policy.

Each device in the power system provided in the third aspect is configured to perform the method provided in the first aspect. Therefore, for beneficial effects of the power system, refer to the beneficial effects of the method. Details are not described herein again.

With reference to the third aspect, in a first possible implementation, when the failure mode of the battery is a combination of at least one failure mode in a first failure mode group and at least one failure mode in a second failure mode group, the power repair policy is: using a first repair policy to repair the battery, after the battery is fully charged, using a second repair policy to repair the battery, and after the second repair policy is used to repair the battery, reusing the first repair policy to repair the battery; the first failure mode group includes the water loss mode, the grid corrosion mode, and the thermal runaway mode, and the second failure mode group includes the internal short-circuit mode, the weak battery mode, and the sulphation mode; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; and the preset voltage is greater than or equal to the standard charging voltage of the battery, and the preset current is greater than or equal to the standard charging current of the battery.

When there are multiple failure modes of the battery, a uniform power repair policy may be used to repair the battery in the multiple failure modes at the same time in the third aspect and the first possible implementation of the third aspect, so as to improve battery repair efficiency.

With reference to the third aspect or the first possible implementation of the third aspect, in a second possible implementation, the processor is specifically configured to: obtain at least one group of test results of the performance parameter of the battery, where one group of test results is corresponding to one test time point; and determine the failure mode of the battery according to the at least one group of test results.

With reference to the second possible implementation of the third aspect, in a third possible implementation, the processor is specifically configured to: determine a degree of matching between the at least one group of test results and a preset condition corresponding to each failure mode in a preset failure mode group; and determine, as the failure mode of the battery, a failure mode corresponding to a preset condition for which a degree of matching between the preset condition and the at least one group of test results is greater than or equal to a second preset threshold.

With reference to any one of the third aspect, or the first possible implementation to the third possible implementation of the third aspect, in a fourth possible implementation, the processor is specifically configured to: obtain a value of the performance parameter of the battery after a third preset time length; determine, according to the value of the performance parameter of the battery, whether the power repair policy is valid; if yes, continue to use the power repair policy to repair the battery until the repairing is completed; and if no, re-obtain multiple groups of test results of the performance parameter of the battery, and re-determine the failure mode of the battery according to the multiple groups of test results, where one group of test results is corresponding to one test time point.

The failure mode may change in a battery repair process or the foregoing at least one group of test results has a relatively large test error due to an external reason, and consequently, the determined failure mode is inaccurate. Therefore, in the fourth possible implementation of the third aspect, it may be determined, after a third preset time period for repairing the battery, whether the power repair policy is valid, so as to adjust the power repair policy in a timely manner, and improve repair accuracy.

With reference to the fourth possible implementation of the third aspect, in a fifth possible implementation, the processor is specifically configured to: when the failure mode is one or more of the water loss mode, the grid corrosion mode, or the thermal runaway mode, where the value of the performance parameter of the battery is a value of a float charging current of the battery, if the value of the float charging current of the battery is less than a float charging current average in the at least one group of test results, determine that the power repair policy is valid, and otherwise, determine that the power repair policy is invalid; and when the failure mode of the battery is one or more of the internal short-circuit mode, the weak battery mode, or the sulphation mode, where the value of the performance parameter of the battery is a temperature rise value and a capacity value of the battery, if the temperature rise value of the battery is less than a temperature rise average in the at least one group of test results, and/or when the capacity value of the battery is greater than a capacity average in the at least one group of test results, determine that the power repair policy is valid, and otherwise, determine that the power repair policy is invalid.

With reference to any one of the third aspect, or the first possible implementation to the fifth possible implementation of the third aspect, in a sixth possible implementation, the battery includes a battery string and/or a battery cell, and the battery string includes at least two battery cells.

With reference to any one of the third aspect, or the first possible implementation to the sixth possible implementation of the third aspect, in a seventh possible implementation, the performance parameter of the battery includes at least one of a charging voltage of the battery, a discharge voltage of the battery, a charging current of the battery, a discharge current of the battery, an internal resistance of the battery, the temperature of the battery, an accumulated discharge capacity of the battery, or a capacity of the battery.

BRIEF DESCRIPTION OF DRAWINGS

FIG. 2 is a flowchart of a battery repair method according to an embodiment of the present application;

FIG. 3 is a schematic composition diagram of a battery string according to an embodiment of the present application;

DESCRIPTION OF EMBODIMENTS

To facilitate understanding of the present application, a system to which a method provided in embodiments of the present application is applied is first briefly described. It should be noted that only an example in which the method is applied to a communications system is used for description herein. This does not construct a limitation to mean that the method provided in the embodiments of the present application may be applied only to the communications system.

Figure 1:
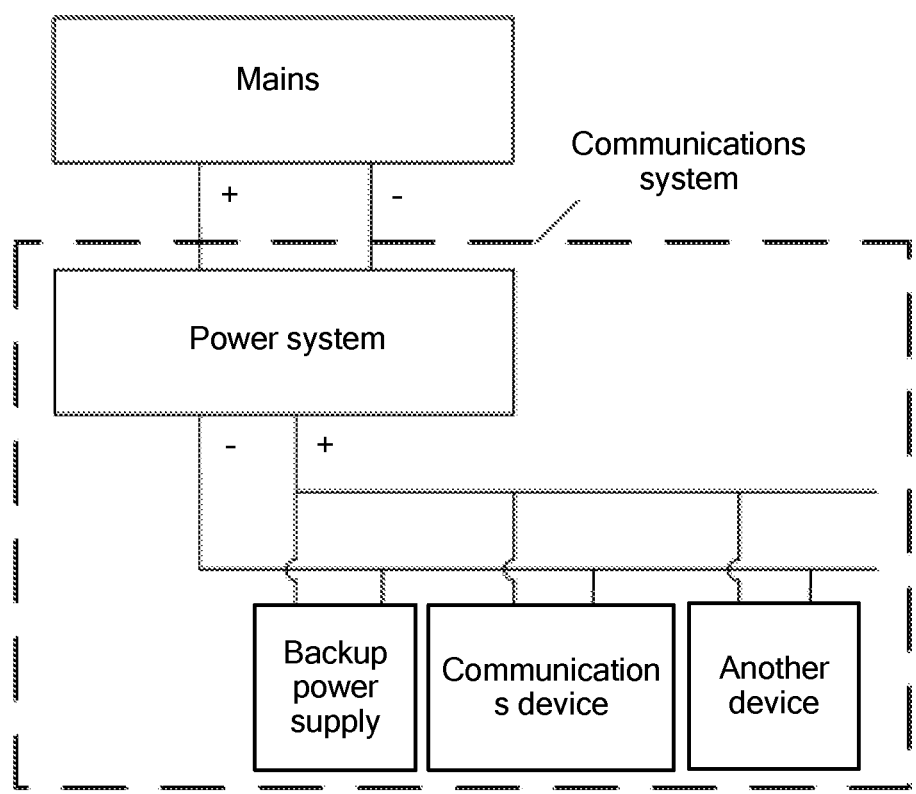
FIG. 1 is a schematic diagram of supplying power to a communications system by the mains according to an embodiment of the present application.

FIG. 1 is a schematic diagram of supplying power to a communications system by the mains. The communications system includes a power system, a backup power supply, a communications device, and another device. One end of the power system is connected to the mains, and the other end is connected to the backup power supply, the communications device, and the another device. The backup power supply is connected to the communications device and the another device.

In the communications field, to avoid a case in which the communications device cannot normally work when power failure occurs on a power grid of a city in which the communications device is located, the backup power supply (the backup power supply usually includes multiple battery cells that are serially connected) is usually disposed. When the power grid normally supplies power, the backup power supply is in an idle state. When power failure occurs on the power grid, the backup power supply supplies power to the communications device and the another device. When the backup power supply is in an idle state, the power grid may charge the backup power supply. A specific process of charging the backup power supply by the power grid is as follows: The mains (which are usually an alternating current of 220 V) enter the power system, and the power system converts an alternating current into a direct current, and then supplies power to the communications device, the backup power supply, and the another device after reducing a voltage to a distribution voltage. The power system may include a controller, a processor, and the like, so as to control a charging voltage, a charging current, and the like for charging the backup power supply.

An embodiment of the present application provides a battery repair method. As shown in FIG. 2, the method includes the following steps.

201. A power system determines a failure mode of a battery according to an abuse record of the battery or a performance parameter of the battery, where the abuse record includes a usage record of a situation in which a preset usage range of the performance parameter of the battery is exceeded, and the performance parameter of the battery is used to represent performance of the battery.

Optionally, the battery includes a battery string and/or a battery cell, and the battery string includes at least two battery cells. Because a capability of a battery cell to output a voltage and a current is limited, a battery cell is usually used in a form of a battery string. For example, as shown in FIG. 3, one battery string may be obtained after several battery cells are serially connected.

The battery cell may be specifically a lead-acid battery, a lithium battery, or the like. For example, the lead-acid battery may be specifically a VRLA.

Optionally, the performance parameter of the battery includes at least one of a charging voltage of the battery, a discharge voltage of the battery, a charging current of the battery, a discharge current of the battery, an internal resistance of the battery, a temperature of the battery, an accumulated discharge capacity of the battery, or a capacity of the battery. It should be noted that, for a battery string and battery cells included in the battery string, an accumulated discharge capacity of the battery string is the same as an accumulated discharge capacity of the battery cells.

It should be noted that a failure mode of a battery string and a failure mode of a battery cell may be the same, or may be different.

Specifically, a sulphation mode is a failure mode in which a coarse lead sulfate crystal is formed on a negative plate of the battery, and consequently, the capacity of the battery decreases. Specifically, when the battery is in an undervoltage state for a long time, the battery may be sulphated.

A water loss mode is a failure mode in which moisture inside the battery is lost quickly, and consequently, the capacity of the battery decreases. Specifically, when the battery is in a high temperature environment for a long time and/or in a state in which a high voltage is used to charge the battery for a long time, water loss may occur on the battery.

A grid corrosion mode is a failure mode in which a grid of the battery is corroded, and consequently, the capacity of the battery decreases. Specifically, when high temperature and high voltage float charging is performed on the grid of the battery for a long time, the grid of the battery may be corroded.

An active substance shedding mode is a failure mode in which active substances on a positive and negative plate of the battery are shed, and consequently, the capacity of the battery decreases. Specifically, when the battery is circularly charged and discharged for a long time, the positive and negative plate of the battery expand and shrink repeatedly, so that the active substances on the positive and negative plate are shed.

A thermal runaway mode is a failure mode in which the temperature of the battery is excessively high, and consequently, the battery expands. Specifically, when mutual positive feedbacks are formed between a current and the temperature of the battery when float charging is performed on the battery in a high temperature environment, that is, when the temperature of the battery increases, and accordingly the internal resistance of the battery decreases, a float charging current increases, and the temperature of the battery becomes higher. This vicious circle results in an excessively high temperature of the battery, and consequently, the battery may be in the thermal runaway mode.

An internal short-circuit mode is a failure mode in which there is an impurity or a crystal dendrite inside the battery, and consequently, an interior of the battery is slightly or severely short-circuited and the capacity of the battery decreases. When the battery is in the failure mode of the internal short-circuit mode, self-discharge of the battery is high, and consequently, a voltage of the battery is low.

A weak battery mode is a failure mode in which a single battery quickly fails, and consequently, the capacity of the battery decreases. A cause may be that the battery is a defective product.

When the failure mode of the battery is determined according to the performance parameter of the battery, during specific implementation, step 201 may include the following steps: (11) The power system obtains at least one group of test results of the performance parameter of the battery, where one group of test results is corresponding to one test time point. (12) The power system determines the failure mode of the battery according to the at least one group of test results.

For example, when the performance parameter of the battery includes the internal resistance of the battery and the temperature of the battery, five groups of test results may be obtained by performing tests at five test time points. A first group of test results include $A_1$ and $B_1$, a second group of test results include $A_2$ and $B_2$, a third group of test results include $A_3$ and $B_3$, a fourth group of test results include $A_4$ and $B_4$, and a fifth group of test results include $A_5$ and $B_5$. For details, refer to Table 1.

TABLE 1

| External characteristic parameter of the battery | Test time point 1 | Test time point 2 | Test time point 3 | Test time point 4 | Test time point 5 |
|---|---|---|---|---|---|
| Internal resistance of the battery | $A_1$ | $A_2$ | $A_3$ | $A_4$ | $A_5$ |
| Temperature of the battery | $B_1$ | $B_2$ | $B_3$ | $B_4$ | $B_5$ |

For example, when it is determined, according to the at least one group of test results, that the battery is in a float charging state, the current of the battery continuously increases, the temperature of the battery continuously increases and exceeds a specific value (setting of the value is related to a type of the battery), and the internal resistance of the battery continuously decreases, it is determined that the failure mode of the battery is the thermal runaway mode.

It should be noted that it may be learned, according to the at least one group of test results, that the battery does not fail.

During specific implementation, step (12) may include the following steps: The power system determines a degree of matching between the at least one group of test results and a preset condition corresponding to each failure mode in a preset failure mode group. The power system determines, as the failure mode of the battery, a failure mode corresponding to a preset condition for which a degree of matching between the preset condition and the at least one group of test results is greater than or equal to a second preset threshold.

Optionally, when the battery is a battery cell, the preset failure mode group may include multiple modes of the following failure modes: the sulphation mode, the water loss mode, the grid corrosion mode, the active substance shedding mode, the thermal runaway mode, the internal short-circuit mode, and the weak battery mode. When the battery is a battery string, the preset failure mode group may include multiple modes of the following failure modes: the sulphation mode, the water loss mode, the grid corrosion mode, the active substance shedding mode, and the thermal runaway mode.

Specifically, a degree of matching between the at least one group of test results and a preset condition corresponding to each failure mode may be calculated by using at least one algorithm of a model matching algorithm, a neural network algorithm, an echo state network algorithm, or a vector machine algorithm.

Setting of the second preset threshold may be determined according to an actual application scenario. For example, the second preset threshold may be 80% or 70%.

Specifically, a frequently-used battery string of 48 V including 24 battery cells in the communications field is used as an example below. For a preset condition corresponding to each failure mode, refer to Table 2.

TABLE 2

| Failure mode | Preset condition corresponding to the battery string | Preset condition corresponding to a battery cell |
| --- | --- | --- |
| Sulphation mode | When the battery string is in a fully charged state, and a discharge current is 10% of the capacity of the battery, a voltage instantaneously decreases to a value below 48 V; an internal resistance gradually increases, and the internal resistance of the battery string increases by at least 30% compared with an initial resistance; a capacity gradually decreases, and the capacity of the battery string decreases by at least 20% compared with an initial capacity; when the discharge current is 10% of the capacity of the battery, a temperature rise of the battery string increases by 5 degrees | When the battery cell is in a fully charged state, and a discharge current is 10% of the capacity of the battery, a voltage instantaneously decreases to a value below 2 V; an internal resistance gradually increases, and the internal resistance of the battery cell increases by at least 30% compared with an initial resistance; a capacity gradually decreases, and the capacity of the battery cell decreases by at least 20% compared with an initial capacity; when the discharge current is 10% of the capacity of the battery, a temperature rise of the battery cell increases by 5 degrees |
| Water loss mode | A time when the battery string is in a temperature greater than or equal to 40 degrees exceeds 300 h/year or a time when a charging voltage of the battery string is greater than or equal to 56.0 V exceeds 2000 h/year; an internal resistance gradually increases, and the internal resistance of the battery string increases by at least 30% compared with an initial resistance; a float charging current is greater than a capacity of the battery string by at least 3‰ | A time when the battery cell is in a temperature greater than or equal to 40 degrees exceeds 300 h/year or a time when a charging voltage of the battery cell is greater than or equal to 2.3 V exceeds 2000 h/year; an internal resistance gradually increases, and the internal resistance of the battery cell increases by at least 30% compared with an initial resistance; a float charging current is greater than a capacity of the battery cell by at least 3‰ |
| Grid corrosion mode | A time when the battery string is in a temperature greater than or equal to 40 degrees exceeds 300 h/year or a time when a charging voltage of the battery string is greater than or equal to 56.0 V exceeds 2000 h/year; an internal resistance of the battery string increases by no more than 30% compared with an initial resistance | A time when the battery cell is in a temperature greater than or equal to 40 degrees exceeds 300 h/year or a time when a charging voltage of the battery cell is greater than or equal to 2.3 V exceeds 2000 h/year; an internal resistance of the battery cell increases by no more than 30% compared with an initial resistance |
| Active substance shedding mode | A quantity of times of discharge with a 50% depth of discharge amounts to at least 300 times; an internal resistance gradually increases, and the internal resistance of the battery string increases by at least 30% compared with an initial resistance; a capacity gradually decreases, the capacity of the battery string decreases by at least 20% | A quantity of times of discharge with a 50% depth of discharge amounts to at least 300 times; an internal resistance gradually increases, and the internal resistance of the battery cell increases by at least 30% compared with an initial resistance; a capacity gradually decreases, the capacity of the battery cell decreases by at least 20% |

TABLE 2-continued

| Failure mode | Preset condition corresponding to the battery string | Preset condition corresponding to a battery cell |
| --- | --- | --- |
| | compared with an initial capacity, and an accumulated discharge capacity is greater than 100 times the capacity of the battery string | compared with an initial capacity, and an accumulated discharge capacity is greater than 100 times the capacity of the battery cell |
| Thermal runaway mode | A temperature is greater than or equal to 40 degrees and continuously increases up to a degree over 60 degrees; a float charging current gradually increases with an increment of at least 30%; an internal resistance gradually decreases and decreases by at least 30% compared with an internal resistance value in a previous fully charged state | A temperature is greater than or equal to 40 degrees and continuously increases up to a degree over 60 degrees; a float charging current gradually increases with an increment of at least 30%; an internal resistance gradually decreases and decreases by at least 30% compared with an internal resistance value in a previous fully charged state |
| Internal short-circuit mode | None | A discharge cutoff voltage of the battery cell is lower than 1.8 V, and cutoff voltages used during recent 50 times of charging and discharge always keep decreasing |
| Weak battery mode | None | A charging cutoff voltage of the battery cell is highest among all the battery cells, and a discharge cutoff voltage of the battery cell is lowest among those of all the battery cells |

A temperature rise of the battery is obtained by subtracting, from the temperature of the battery, an environment temperature of an environment in which the battery is located.

The abuse record is used to record a quantity of times, a time, and the like of abuse such as overdischarge, overcharging, and an excessively high temperature of the battery. It may be determined, according to the abuse record, whether the failure mode of the battery is the sulphation mode or the water loss mode. Specifically, for the battery string, when overdischarge of the battery string occurs at least five times totally, it is determined that the failure mode of the battery string is the sulphation mode, and when an accumulated time when the temperature of the battery string is greater than or equal to 65° C. exceeds 100 h or an accumulated time when the charging voltage of the battery string is greater than or equal to 57 V exceeds 100 h, it is determined that the failure mode of the battery string is the water loss mode. For the battery cell, when overdischarge of the battery cell occurs at least five times totally, it is determined that the failure mode of the battery cell is the sulphation mode; when an accumulated time when the temperature of the battery cell is greater than or equal to 65° C. exceeds 100 h or an accumulated time when the charging voltage of the battery cell is greater than or equal to 2.4 V exceeds 100 h, it is determined that the failure mode of the battery cell is the water loss mode. The preset usage range of the performance parameter of the battery is preset during battery manufacturing.

When the discharge voltage of the battery string is lower than 20 V, it is considered that the battery string is overdischarged. When the discharge voltage of the battery cell is lower than 0.83 V, it is considered that the battery cell is overdischarged.

202. The power system determines, according to the failure mode of the battery, a power repair policy for repairing the battery, where when the failure mode of the battery is at least one of a water loss mode, a grid corrosion mode, or a thermal runaway mode, the power repair policy is: reducing a float charging voltage of the battery to charge the battery or reducing an equalized charging voltage to charge the battery or starting intermittent charging to charge the battery, and enhancing a refrigeration measure of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, where the preset voltage is greater than or equal to a standard charging voltage of the battery, and the preset current is greater than or equal to a standard charging current of the battery.

It should be noted that in addition to repairing the battery by using the power system, the battery may be repaired by using an external repair device except the power system. In this case, in the communications system shown in FIG. 1, the backup power supply may be further connected to the external repair device, and the external repair device is configured to perform external repair on the battery by using an external repair policy.

Figure 4:
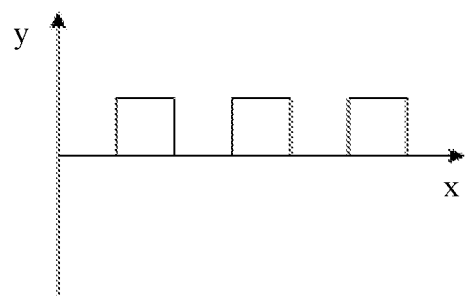
FIG. 4 is a schematic diagram of a pulse whose waveform is a square wave according to an embodiment of the present application.

Specifically, after the failure mode is determined, the external repair policy may use a prior-art method. For example, when the failure mode of the battery is the sulphation mode, a coarse lead sulfate crystal is formed on the negative plate of the battery. In this case, the battery may be charged by using a pulse that is shown in FIG. 4 and whose waveform is a square wave, and the lead sulfate crystal is smashed by means of harmonic vibration and crystal resonance, so that the lead sulfate crystal re-participates in a reaction inside the battery. Certainly, a waveform of a pulse for charging the battery may be a triangular wave, a combined harmonic wave, or the like. Only an example of description is provided in FIG. 4.

A power repair policy corresponding to each failure mode may be as follows (it should be noted that only an example of description is provided herein, and a specific power repair policy may be different due to different operating environments of the battery):

In a power repair policy corresponding to the sulphation mode, according to a type of the battery (different types lead to different elevated voltages), a sulphation degree (the sulphation degree may be determined according to the internal resistance of the battery, and a larger internal resistance of the battery leads to a higher sulphation degree), and the like, when the battery is fully charged, the charging voltage and the charging current of the battery are elevated, and the battery is charged for the first preset time length, so as to smash a part of a lead sulfate crystal, and monitor the temperature of the battery in real time. In this way, the temperature of the battery falls within a proper range (for example, less than 45° C.), and the battery is prevented from generating an another-mode failure. Generally, the charging voltage for charging the battery is greater than or equal to the standard charging voltage of the battery, and the charging current for charging the battery is greater than or equal to the standard charging current of the battery.

In a power repair policy corresponding to the water loss mode, because a higher charging voltage of the battery indicates that more water is electrolyzed inside the battery, the float charging voltage or the equalized charging voltage of the battery may be reduced according to a type of the battery. Because a higher temperature of the battery indicates that more water of the battery is lost, the intermittent charging may be used, a charging time of the battery may be shortened, and the refrigeration measure of the battery may be enhanced, so as to reduce the temperature of the battery.

Alternatively, if the battery has a water supply system, the battery is activated for water supply.

In a power repair policy corresponding to the grid corrosion mode, because a reason why the battery is in the grid corrosion mode is mainly that the battery is in a high temperature or high voltage charging state, the charging voltage and the temperature of the battery may be controlled by reducing the float charging voltage or the equalized charging voltage of the battery or starting the intermittent charging, reducing the current of the battery, and enhancing the refrigeration measure of the system.

In a power repair policy corresponding to the active substance shedding mode, a depth of discharge and a quantity of times of circular charging and discharge of the battery are reduced as much as possible, or a part of unimportant load is cut off, so as to reduce the discharge current of the battery, and slow down discharge of the battery.

In a power repair policy corresponding to the thermal runaway mode, according to a type of the battery, the float charging voltage or the equalized charging voltage of the battery is reduced or the intermittent charging is started, a charging time of the battery is shortened, and the refrigeration measure of the system is enhanced, so as to reduce the temperature of the battery.

In a power repair policy corresponding to the internal short-circuit mode (or the weak battery mode), forced equalized charging is started for the battery, and if the battery has an equalizing system, equalizing is performed on a fixed point of a short-circuited battery (or a weak battery), and an alarm is reported to request operation and maintenance personnel to replace the short-circuited battery.

Specifically, for a correspondence between a power repair policy and a failure mode, refer to Table 3.

TABLE 3

| | Power repair policy | |
|---|---|---|
| Failure mode | Battery string | Battery cell |
| Sulphation mode | When the battery is fully charged, the charging voltage and the charging current of the battery are elevated, the battery is charged for the first preset time length, and the temperature of the battery is monitored in real time, so that the temperature of the battery falls within the proper range | Same as that of the battery string |
| Water loss mode | The float charging voltage of the battery is reduced to charge the battery or the equalized charging voltage is reduced to charge the battery or the intermittent charging is started to charge the battery, and the refrigeration measure of the system is enhanced, so as to reduce the temperature of the battery; if the battery has the water supply system, the battery is activated for water supply | Same as that of the battery string |
| Grid corrosion mode | The float charging voltage of the battery is reduced to charge the battery or the equalized charging voltage is reduced to charge the battery or the intermittent charging is started to charge the battery, the current of the battery is reduced, and the refrigeration measure of the system is enhanced | Same as that of the battery string |
| Active substance shedding mode | The depth of discharge and the quantity of times of circular charging and discharge of the battery are reduced, and the part of unimportant load is cut off, so as to | Same as that of the battery string |

TABLE 3-continued

| | Power repair policy | |
|---|---|---|
| Failure mode | Battery string | Battery cell |
| Thermal runaway mode | reduce the discharge current of the battery The float charging voltage of the battery is reduced to charge the battery or the equalized charging voltage is reduced to charge the battery or the intermittent charging is started to charge the battery, and the refrigeration measure of the system is enhanced | Same as that of the battery string |
| Internal short-circuit mode | None | The forced equalized charging is started for the battery, and if the battery has the equalizing system, equalizing is performed on a fixed point of the short-circuited battery |
| Weak battery mode | None | The forced equalized charging is started for the battery, and if the battery has the equalizing system, equalizing is performed on a fixed point of the weak battery |

Specifically, when there is only one failure mode of the battery, a power repair policy corresponding to the failure mode may be used to repair the battery. When there are multiple failure modes of the battery, power repair policies corresponding to the failure modes may be used to successively repair the battery. In addition, a uniform power repair policy may be used to repair the battery in the multiple failure modes at the same time. Details are shown in Table 4. Power repair policies are listed in Table 4 for repairing the battery in multiple failure modes at the same time when there are the multiple failure modes of the battery.

TABLE 4

| | Power repair policy | |
|---|---|---|
| Failure mode | Battery string | Battery cell |
| One or more of the water loss mode, the grid corrosion mode, or the thermal runaway mode | The float charging voltage of the battery is reduced to charge the battery or the equalized charging voltage is reduced to charge the battery or the intermittent charging is started to charge the battery, and the refrigeration measure of the battery is enhanced | Same as that of the battery string |
| One or more of the internal short-circuit mode, the weak battery mode, or the sulphation mode | When the battery is in a fully charged state, the preset voltage and the preset current are used to charge the battery for the first preset time length, and the temperature of the battery is enabled to be less than or equal to the first preset threshold; and the preset voltage is greater than or equal to the standard charging voltage of the battery, and the preset current is greater than or equal to the standard charging current of the battery | Same as that of the battery string |
| Combination of at least one failure mode in a first failure mode group and at least one failure mode in a second failure mode group, where the first failure mode group includes the water loss mode, the grid corrosion mode, and the thermal runaway mode, and the second failure mode group includes the internal short-circuit mode, the weak battery mode, and the sulphation mode | The first repair policy is used to repair the battery, when the battery is fully charged, the second repair policy is used to repair the battery, and after the second repair policy is used to repair the battery, the first repair policy is reused to repair the battery; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; the preset voltage is greater than or equal to the standard charging voltage of the battery, and the preset current is greater than or equal to the standard charging current of the battery | Same as that of the battery string |

The second preset time length is less than the first preset time length. For example, the second preset time length may be a half of the first preset time length. The first preset threshold may be set according to an actual application scenario. For example, the first preset threshold may be 45° C.

In this method, the uniform power repair policy is used to repair the battery in the multiple failure modes at the same time, so that repair efficiency can be improved.

In the prior art, a charging and discharge management system of the battery is usually implemented in a manner such as a manner with a preset constant voltage and limited current. This only implements a basic function that the battery is charged and discharged in a usual environment, and cannot adjust a charging and discharge management system according to a change of the battery. Consequently, a useful life of the battery is shortened. In this embodiment of the present application, the power repair policy is used to repair the battery during failure of the battery, so that the useful life of the battery can be prolonged.

203. The power system repairs the battery according to a selected power repair policy.

Beneficial effects are as follows: When there is only one failure mode of the battery, a power repair policy corresponding to the failure mode may be used to repair the battery. When there are multiple failure modes of the battery, power repair policies corresponding to the failure modes may be used to successively repair the battery. In addition, a uniform power repair policy may be used to repair the battery in the multiple failure modes at the same time.

Optionally, the power system obtains a value of the performance parameter of the battery after a third preset time length.

The third preset time length may be set according to an actual application scenario, and the third preset time length is less than a total time length for repairing the battery.

205. The power system determines, according to the value of the performance parameter of the battery, whether the power repair policy is valid.

If yes, the power system continues to use the power repair policy to repair the battery until the repairing is completed. If no, the power system re-obtains multiple groups of test results of the performance parameter of the battery, and re-determines the failure mode of the battery according to the multiple groups of test results. One group of test results is corresponding to one test time point.

It should be noted that the failure mode may change in a battery repair process or the foregoing at least one group of test results has a relatively large test error due to an external reason, and consequently, the determined failure mode is inaccurate. Therefore, it may be determined, after a third preset time period for repairing the battery, whether the power repair policy is valid, so as to adjust the power repair policy in a timely manner, and improve repair accuracy.

Optionally, during specific implementation, step 205 may include the following steps: When the failure mode is one or more of the water loss mode, the grid corrosion mode, or the thermal runaway mode, where the value of the performance parameter of the battery is a value of a float charging current of the battery, if the value of the float charging current of the battery is less than a float charging current average in the at least one group of test results, the power system determines that the power repair policy is valid, and otherwise, the power system determines that the power repair policy is invalid; and when the failure mode of the battery is one or more of the internal short-circuit mode, the weak battery mode, or the sulphation mode, where the value of the performance parameter of the battery is a temperature rise value and a capacity value of the battery, if the temperature rise value of the battery is less than a temperature rise average in the at least one group of test results, and/or when the capacity value of the battery is greater than a capacity average in the at least one group of test results, the power system determines that the power repair policy is valid, and otherwise, the power system determines that the power repair policy is invalid.

In addition, when the battery is a battery cell, the value of the performance parameter of the battery may also be a charging voltage of the battery that is used when the battery is charged and a cutoff voltage of the battery. If the charging voltage of the battery that is used when the power system charges the battery is greater than an average, in the at least one group of test results, of charging voltages of the battery that are used when the battery is charged, and/or when the cutoff voltage of the battery is greater than an average of cutoff voltages of the battery in the at least one group of test results, it may also be considered that the power repair policy is valid.

The value of the performance parameter of the battery may be a single value, or may be an average of multiple obtained values of performance parameters. For example, for a method for determining whether the power repair policy is valid in different failure modes, refer to Table 5.

TABLE 5

| | Method for determining whether the power repair policy is valid | |
| --- | --- | --- |
| Failure mode | Battery string | Battery cell |
| One or more of the water loss mode, the grid corrosion mode, or the thermal runaway mode | If the value of the float charging current of the battery is less than the float charging current average in the at least one group of test results, it is determined that the power repair policy is valid, and otherwise, it is determined that the power repair policy is invalid | Same as that of the battery string |
| One or more of the internal short-circuit mode, the weak battery mode, or the sulphation mode | If the temperature rise value of the battery is less than the temperature rise average in the at least one group of test results, and/or when the capacity value | When one or more of the following conditions are met, it is determined that the power repair policy is valid, and otherwise, it is determined that |

TABLE 5-continued

| | Method for determining whether the power repair policy is valid | |
|---|---|---|
| Failure mode | Battery string | Battery cell |
| | of the battery is greater than the capacity average in the at least one group of test results, it is determined that the power repair policy is valid, and otherwise, it is determined that the power repair policy is invalid | the power repair policy is invalid; the conditions are: the temperature rise value of the battery is less than the temperature rise average in the at least one group of test results; the capacity value of the battery is greater than the capacity average in the at least one group of test results; the charging voltage of the battery that is used when the power system charges the battery is greater than the average, in the at least one group of test results, of the charging voltages of the battery that are used when the battery is charged; the cutoff voltage of the battery is greater than the average of the cutoff voltages of the battery in the at least one group of test results |

In the active substance shedding mode, it cannot be determined whether the power repairing policy is valid. Therefore, when the failure mode is only the active substance shedding mode, steps 204 and 205 are not performed.

In this embodiment of the present application, because steps 204 and 205 are performed, a closed-loop repair mode is formed for battery repair. This may further avoid a problem that a battery loss may be increased because the determined failure mode is inaccurate.

According to the method provided in this embodiment of the present application, after the failure mode of the battery is determined, the power repair policy of the battery is further determined. The battery is repaired in a specific manner, so that the useful life of the battery can be prolonged. Because the battery that is in the multiple failure modes may be further repaired, battery repair efficiency can be improved.

Figure 5:
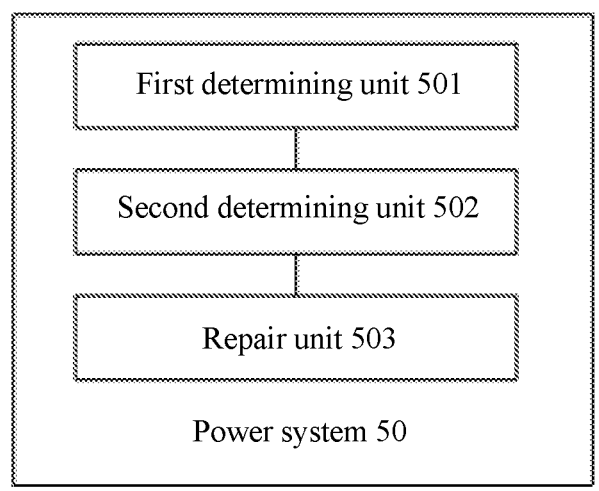
FIG. 5 is a schematic composition diagram of a power system according to an embodiment of the present application.

An embodiment of the present application further provides a power system 50. As shown in FIG. 5, the power system 50 includes:

a first determining unit 501, configured to determine a failure mode of a battery according to an abuse record of the battery or a performance parameter of the battery, where the abuse record includes a usage record of a situation in which a preset usage range of the performance parameter of the battery is exceeded, and the performance parameter of the battery is used to represent performance of the battery;

a second determining unit 502, configured to determine, according to the failure mode of the battery, a power repair policy for repairing the battery, where when the failure mode of the battery is at least one of a water loss mode, a grid corrosion mode, or a thermal runaway mode, the power repair policy is: reducing a float charging voltage of the battery to charge the battery or reducing an equalized charging voltage to charge the battery or starting intermittent charging to charge the battery, and enhancing a refrigeration measure of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, where the preset voltage is greater than or equal to a standard charging voltage of the battery, and the preset current is greater than or equal to a standard charging current of the battery; and a repair unit 503, configured to repair the battery according to a selected power repair policy.

Optionally, when the failure mode of the battery is a combination of at least one failure mode in a first failure mode group and at least one failure mode in a second failure mode group, the power repair policy is: using a first repair policy to repair the battery, after the battery is fully charged, using a second repair policy to repair the battery, and after the second repair policy is used to repair the battery, reusing the first repair policy to repair the battery; the first failure mode group includes the water loss mode, the grid corrosion mode, and the thermal runaway mode, and the second failure mode group includes the internal short-circuit mode, the weak battery mode, and the sulphation mode; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; and the preset voltage is greater than or equal to the standard charging voltage of the battery, and the preset current is greater than or equal to the standard charging current of the battery.

Figure 6:
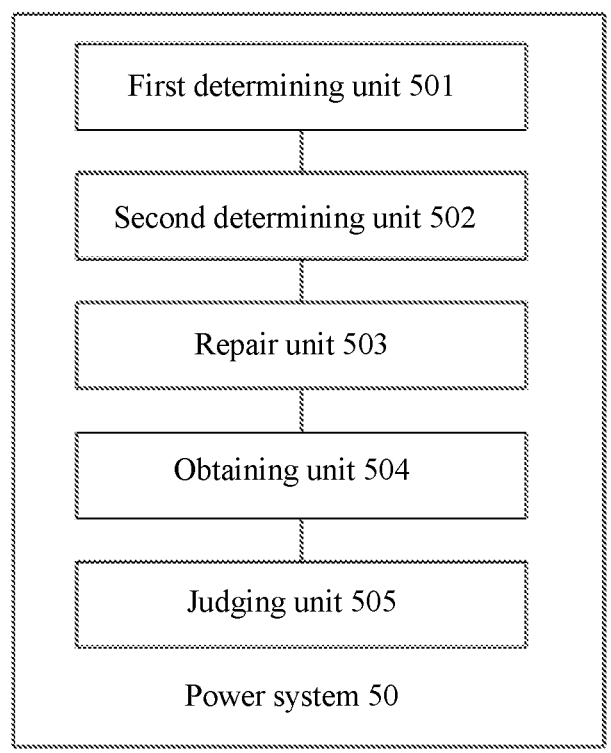
FIG. 6 is a schematic composition diagram of another power system according to an embodiment of the present application.

Optionally, as shown in FIG. 6, the power system 50 further includes an obtaining unit 504.

The obtaining unit 504 is configured to obtain at least one group of test results of the performance parameter of the battery. One group of test results is corresponding to one test time point.

The first determining unit 501 is specifically configured to determine the failure mode of the battery according to the at least one group of test results.

Optionally, the first determining unit 501 is specifically configured to:

determine a degree of matching between the at least one group of test results and a preset condition corresponding to each failure mode in a preset failure mode group; and determine, as the failure mode of the battery, a failure mode corresponding to a preset condition for which a degree of matching between the preset condition and the at least one group of test results is greater than or equal to a second preset threshold.

Optionally, the obtaining unit 504 is further configured to obtain a value of the performance parameter of the battery after a third preset time length.

As shown in FIG. 6, the power system 50 further includes a judging unit 505, configured to determine, according to the value of the performance parameter of the battery, whether the power repair policy is valid.

If yes, the repair unit 503 continues to use the power repair policy to repair the battery until the repairing is completed.

If no, the obtaining unit 504 re-obtains multiple groups of test results of the performance parameter of the battery, and the first determining unit 501 is further configured to re-determine the failure mode of the battery according to the multiple groups of test results. One group of test results is corresponding to one test time point.

Optionally, the judging unit 505 is specifically configured to:

when the failure mode is one or more of the water loss mode, the grid corrosion mode, or the thermal runaway mode, where the value of the performance parameter of the battery is a value of a float charging current of the battery, if the value of the float charging current of the battery is less than a float charging current average in the at least one group of test results, determine that the power repair policy is valid, and otherwise, determine that the power repair policy is invalid; and when the failure mode of the battery is one or more of the internal short-circuit mode, the weak battery mode, or the sulphation mode, where the value of the performance parameter of the battery is a temperature rise value and a capacity value of the battery, if the temperature rise value of the battery is less than a temperature rise average in the at least one group of test results, and/or when the capacity value of the battery is greater than a capacity average in the at least one group of test results, determine that the power repair policy is valid, and otherwise, determine that the power repair policy is invalid.

Optionally, the battery includes a battery string and/or a battery cell, and the battery string includes at least two battery cells.

Optionally, the performance parameter of the battery includes at least one of a charging voltage of the battery, a discharge voltage of the battery, a charging current of the battery, a discharge current of the battery, an internal resistance of the battery, the temperature of the battery, an accumulated discharge capacity of the battery, or a capacity of the battery.

Each unit in the power system 50 provided in this embodiment of the present application is configured to perform the foregoing method. Therefore, for beneficial effects of the power system 50, refer to the beneficial effects of the foregoing method. Details are not described herein again.

Figure 7:
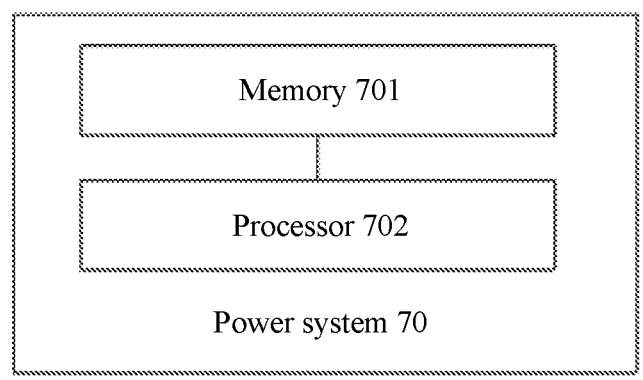
FIG. 7 is a schematic composition diagram of another power system according to an embodiment of the present application.

An embodiment of the present application further provides a power system 70. As shown in FIG. 7, the power system 70 includes a memory 701 and a processor 702. The memory 701 is configured to store code, and the processor 702 is configured to perform, according to the code, the method shown in FIG. 2.

Each functional unit in the power system may be built in or independent of the processor of the power system in a form of hardware, or may be stored in the processor of the power system in a form of software, so that the processor invokes and executes the operations corresponding to each unit. The foregoing processor may be a central processing unit (Central Processing Unit, CPU for short), a general purpose processor, a digital signal processor (Digital Signal Processor, DSP for short), an application-specific integrated circuit (Application Specific Integrated Circuit, ASIC for short), a field programmable gate array (Field Programmable Gate Array, FPGA for short) or another programmable logic device, a transistor logic device, or a hardware component or any combination thereof. The processor may implement or execute various example logical blocks, modules, and circuits described with reference to content disclosed in the present application. Alternatively, the processor may be a combination of processors implementing a computing function, for example, a combination of one or more microprocessors or a combination of a DSP and a microprocessor.

Method steps described in combination with the content disclosed in the present application may be implemented by hardware, or may be implemented by the processor by executing a software instruction. The software instruction may include a corresponding software module. The software module may be stored in a random access memory (Random Access Memory, RAM for short), a flash memory, a read-only memory (Read Only Memory, ROM for short), an erasable programmable read only memory (Erasable Programmable ROM, EPROM for short), an electrically erasable programmable read only memory (Electrically EPROM, EEPROM for short), a register, a hard disk, a mobile hard disk, a compact disc read-only memory (CD-ROM), or any other form of storage medium well known in the art. For example, a storage medium is coupled to the processor, so that the processor can read information from the storage medium or write information into the storage medium. Certainly, the storage medium may be a component of the processor. The processor and the storage medium may be located in an ASIC.

Each device in the power system 70 provided in this embodiment of the present application is configured to perform the foregoing method. Therefore, for beneficial effects of the power system 70, refer to the beneficial effects of the foregoing method. Details are not described herein again.

In the several embodiments provided in this application, it should be understood that the disclosed apparatus and method may be implemented in other manners. For example, the apparatus embodiment described above is merely an example. For example, the module division is merely logical function division and may be other division in actual implementation. For example, a plurality of modules or components may be combined or integrated into another system, or some features may be ignored or not performed.

In addition, functional modules in the embodiments of this application may be integrated into one processing module, or each of the modules may exist alone physically, or two or more modules are integrated into one module. The integrated module may be implemented in a form of hardware, or may be implemented in a form of a software functional module.

In conclusion, the foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A battery repair method, comprising:
    determining, by a power system, a failure mode of a battery according to an abuse record of the battery or a performance parameter of the battery, wherein the abuse record comprises a usage record including a value of the performance parameter beyond a preset usage range of the performance parameter of the battery, and the performance parameter of the battery represents the performance of the battery;
    determining, by the power system according to the failure mode of the battery, a power repair policy for repairing the battery, wherein when the failure mode of the battery is at least one of a water loss mode, a grid corrosion mode, and a thermal runaway mode, the power repair policy is at least one of: reducing a float charging voltage of the battery to charge the battery, reducing an equalized charging voltage to charge the battery, starting intermittent charging to charge the battery, and enhancing refrigeration of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, wherein the preset voltage is greater than or equal to a standard charging voltage of the battery, and the preset current is greater than or equal to a standard charging current of the battery; and
    repairing, by the power system, the battery according to a selected power repair policy.

2. The method according to claim 1, wherein when the failure mode of the battery is a combination of at least one failure mode in a first failure mode group and at least one failure mode in a second failure mode group, the power repair policy is: using a first repair policy to repair the battery, after the battery is fully charged, using a second repair policy to repair the battery, and after the second repair policy is used to repair the battery, reusing the first repair policy to repair the battery; the first failure mode group comprises the water loss mode, the grid corrosion mode, and the thermal runaway mode, and the second failure mode group comprises the internal short-circuit mode, the weak battery mode, and the sulphation mode; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; and the preset voltage is greater than or equal to the standard charging voltage of the battery, and the preset current is greater than or equal to the standard charging current of the battery.

3. The method according to claim 1, wherein the determining, by a power system, a failure mode of the battery according to a performance parameter of the battery comprises:
    obtaining, by the power system, at least one group of test results of the performance parameter of the battery, wherein one group of test results is corresponding to one test time point; and
    determining, by the power system, the failure mode of the battery according to the at least one group of test results.

4. The method according to claim 3, wherein the determining, by the power system, the failure mode of the battery according to the at least one group of test results comprises:
    determining, by the power system, a degree of matching between the at least one group of test results and a preset condition corresponding to each failure mode in a preset failure mode group; and
    determining, by the power system as the failure mode of the battery, a failure mode corresponding to a preset condition for which a degree of matching between the preset condition and the at least one group of test results is greater than or equal to a second preset threshold.

5. The method according to claim 1, wherein after the power system repairs the battery according to the power repair policy, the method further comprises:
    obtaining, by the power system, a value of the performance parameter of the battery after a third preset time length;
    determining, by the power system according to the value of the performance parameter of the battery, whether the power repair policy is valid;
    if the power repair policy is invalid, continuing, by the power system, to use the power repair policy to repair the battery until the repairing is completed; and
    if the value of the float charging current of the battery is greater than or equal to the float charging current average in the at least one group of test results, re-obtaining, by the power system, multiple groups of test results of the performance parameter of the battery, and re-determining the failure mode of the battery according to the multiple groups of test results, wherein one group of test results is corresponding to one test time point.

6. The method according to claim 5, wherein the determining, by the power system according to the value of the performance parameter of the battery, whether the power repair policy is valid comprises:
    when the failure mode is one or more of the water loss mode, the grid corrosion mode, or the thermal runaway mode, wherein the value of the performance parameter of the battery is a value of a float charging current of the battery, if the value of the float charging current of the battery is less than a float charging current average in the at least one group of test results, determining, by the power system, that the power repair policy is valid, and otherwise, determining, by the power system, that the power repair policy is invalid; and
    when the failure mode of the battery is one or more of the internal short-circuit mode, the weak battery mode, or the sulphation mode, wherein the value of the performance parameter of the battery is a temperature rise value and a capacity value of the battery, if the temperature rise value of the battery is less than a temperature rise average in the at least one group of test results, and/or when the capacity value of the battery is greater than a capacity average in the at least one group of test results, determining, by the power system, that the power repair policy is valid, and otherwise, determining, by the power system, that the power repair policy is invalid.

7. The method according to claim 1, wherein the battery comprises at least one of a battery string and a battery cell, and the battery string comprises at least two battery cells.

8. The method according to claim 1, wherein the performance parameter of the battery comprises at least one of a charging voltage of the battery, a discharge voltage of the battery, a charging current of the battery, a discharge current of the battery, an internal resistance of the battery, the temperature of the battery, an accumulated discharge capacity of the battery, and a capacity of the battery.

9. A non-transitory memory storing executable code, that when executed by a processor performs the following actions, comprising:
  determining a failure mode of the battery according to an abuse record of the battery or a performance parameter of the battery, wherein the abuse record comprises a usage record including a preset usage range of the performance parameter of the battery is exceeded, and the performance parameter of the battery is used to represent performance of the battery;
  determining, according to the failure mode of the battery, a power repair policy for repairing the battery, wherein when the failure mode of the battery is at least one of a water loss mode, a grid corrosion mode, or a thermal runaway mode, the power repair policy is:
  reducing a float charging voltage of the battery to charge the battery or reducing an equalized charging voltage to charge the battery or starting intermittent charging to charge the battery, and enhancing a refrigeration measure of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, wherein the preset voltage is greater than or equal to a standard charging voltage of the battery, and the preset current is greater than or equal to a standard charging current of the battery; and
  repairing the battery according to a selected power repair policy.

10. The memory according to claim 9, wherein when the failure mode of the battery is a combination of at least one failure mode in a first failure mode group and at least one failure mode in a second failure mode group, the power repair policy is: using a first repair policy to repair the battery, after the battery is fully charged, using a second repair policy to repair the battery, and after the second repair policy is used to repair the battery, reusing the first repair policy to repair the battery; the first failure mode group comprises the water loss mode, the grid corrosion mode, and the thermal runaway mode, and the second failure mode group comprises the internal short-circuit mode, the weak battery mode, and the sulphation mode; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; and the preset voltage is greater than or equal to the standard charging voltage of the battery, and the preset current is greater than or equal to the standard charging current of the battery.

11. The memory according to claim 9, further comprising instructions for:
  obtaining at least one group of test results of the performance parameter of the battery, wherein one group of test results is corresponding to one test time point; and
  determining the failure mode of the battery according to the at least one group of test results.

12. The memory according to claim 11, wherein the first determining step further includes:
  determining a degree of matching between the at least one group of test results and a preset condition corresponding to each failure mode in a preset failure mode group; and
  determining, as the failure mode of the battery, a failure mode corresponding to a preset condition for which a degree of matching between the preset condition and the at least one group of test results is greater than or equal to a second preset threshold.

13. The memory according to claim 12, further comprising instructions for:
  obtaining a value of the performance parameter of the battery after a third preset time length;
  determining, according to the value of the performance parameter of the battery, whether the power repair policy is valid;
  if yes, using the power repair policy to repair the battery until the repairing is completed; and
  if no, re-obtaining multiple groups of test results of the performance parameter of the battery, and the first determining unit is further configured to re-determine the failure mode of the battery according to the multiple groups of test results, wherein one group of test results is corresponding to one test time point.

14. The memory according to claim 13, further comprising instructions for:
  when the failure mode is one or more of the water loss mode, the grid corrosion mode, or the thermal runaway mode, wherein the value of the performance parameter of the battery is a value of a float charging current of the battery, if the value of the float charging current of the battery is less than a float charging current average in the at least one group of test results, determining that the power repair policy is valid, and otherwise, determining that the power repair policy is invalid; and
  when the failure mode of the battery is one or more of the internal short-circuit mode, the weak battery mode, or the sulphation mode, wherein the value of the performance parameter of the battery is a temperature rise value and a capacity value of the battery, if the temperature rise value of the battery is less than a temperature rise average in the at least one group of test results, and/or when the capacity value of the battery is greater than a capacity average in the at least one group of test results, determining that the power repair policy is valid, and otherwise, determining that the power repair policy is invalid.

15. The memory according to claim 9, wherein the battery comprises a battery string and/or a battery cell, and the battery string comprises at least two battery cells.

16. The memory according to claim 9, wherein the performance parameter of the battery comprises at least one of a charging voltage of the battery, a discharge voltage of the battery, a charging current of the battery, a discharge current of the battery, an internal resistance of the battery, the temperature of the battery, an accumulated discharge capacity of the battery, or a capacity of the battery.

17. A power system, comprising a non-transitory memory and a processor, wherein the memory is configured to store code, and the processor is configured to execute the following actions according to the code:
   determining a failure mode of the battery according to an abuse record of the battery or a performance parameter of the battery, wherein the abuse record comprises a usage record including a preset usage range of the performance parameter of the battery is exceeded, and the performance parameter of the battery represents the performance of the battery;
   determining, according to the failure mode of the battery, a power repair policy for repairing the battery, wherein when the failure mode of the battery is at least one of a water loss mode, a grid corrosion mode, and a thermal runaway mode,
   the power repair policy is at least one: reducing a float charging voltage of the battery to charge the battery or reducing an equalized charging voltage to charge the battery or starting intermittent charging to charge the battery, and enhancing a refrigeration measure of the battery, and when the failure mode of the battery is at least one of an internal short-circuit mode, a weak battery mode, or a sulphation mode, the power repair policy is: when the battery is in a fully charged state, using a preset voltage and a preset current to charge the battery for a first preset time length, and enabling a temperature of the battery to be less than or equal to a first preset threshold, wherein the preset voltage is greater than or equal to a standard charging voltage of the battery, and the preset current is greater than or equal to a standard charging current of the battery; and
   repairing the battery according to a selected power repair policy.

18. The power system according to claim 17, wherein
   when the failure mode of the battery is a combination of at least one failure mode in a first failure mode group and at least one failure mode in a second failure mode group, the power repair policy is: using a first repair policy to repair the battery, after the battery is fully charged, using a second repair policy to repair the battery, and after the second repair policy is used to repair the battery, reusing the first repair policy to repair the battery; the first failure mode group comprises the water loss mode, the grid corrosion mode, and the thermal runaway mode, and the second failure mode group comprises the internal short-circuit mode, the weak battery mode, and the sulphation mode; the first repair policy is: reducing the float charging voltage of the battery to charge the battery or reducing the equalized charging voltage to charge the battery or starting the intermittent charging to charge the battery, and the second repair policy is: using the preset voltage and the preset current to charge the battery for a second preset time length, and enabling the temperature of the battery to be less than or equal to the first preset threshold; and the preset voltage is greater than or equal to the standard charging voltage of the battery, and the preset current is greater than or equal to the standard charging current of the battery.

19. The power system according to claim 17, wherein the processor is specifically configured to:
   obtain at least one group of test results of the performance parameter of the battery, wherein one group of test results is corresponding to one test time point; and
   determine the failure mode of the battery according to the at least one group of test results.

20. The power system according to claim 19, wherein the processor is specifically configured to:
   determine a degree of matching between the at least one group of test results and a preset condition corresponding to each failure mode in a preset failure mode group; and
   determine, as the failure mode of the battery, a failure mode corresponding to a preset condition for which a degree of matching between the preset condition and the at least one group of test results is greater than or equal to a second preset threshold.

* * * * *